(12) United States Patent
Kamp et al.

(10) Patent No.: US 9,484,214 B2
(45) Date of Patent: Nov. 1, 2016

(54) SYSTEMS AND METHODS FOR IMPROVING WAFER ETCH NON-UNIFORMITY WHEN USING TRANSFORMER-COUPLED PLASMA

(71) Applicant: Lam Research Corporation, Fremont, CA (US)

(72) Inventors: Tom Kamp, San Jose, CA (US); Arthur Sato, San Jose, CA (US); Alex Paterson, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 187 days.

(21) Appl. No.: 14/293,547

(22) Filed: Jun. 2, 2014

(65) Prior Publication Data

US 2015/0235808 A1 Aug. 20, 2015

Related U.S. Application Data

(60) Provisional application No. 61/941,778, filed on Feb. 19, 2014.

(51) Int. Cl.
*G01P 3/48* (2006.01)
*H01L 21/3065* (2006.01)
*H01J 37/32* (2006.01)

(52) U.S. Cl.
CPC ......... *H01L 21/3065* (2013.01); *H01J 37/321* (2013.01); *H01J 37/3211* (2013.01); *H01J 37/32119* (2013.01)

(58) Field of Classification Search
CPC ..... H01J 37/32; H01L 21/67; H01L 21/3065
See application file for complete search history.

(56) References Cited

U.S. PATENT DOCUMENTS

| | | | | |
|---|---|---|---|---|
| 5,800,619 | A * | 9/1998 | Holland | H01J 37/321 118/723 I |
| 6,447,651 | B1 * | 9/2002 | Ishikawa | C23C 16/45508 204/192.1 |
| 6,939,811 | B2 | 9/2005 | Kamp et al. | |
| 7,571,697 | B2 * | 8/2009 | Benjamin | H05H 1/46 118/723 I |
| 7,851,369 | B2 | 12/2010 | Kamp | |
| 8,124,540 | B2 | 2/2012 | Kamp | |
| 2005/0145341 | A1 * | 7/2005 | Suzuki | H01J 37/321 156/345.49 |
| 2006/0024451 | A1 * | 2/2006 | Mungkekar | H01J 37/321 427/569 |
| 2007/0034153 | A1 * | 2/2007 | Lu | H01J 37/32522 118/723 I |
| 2012/0273130 | A1 | 11/2012 | Drewery et al. | |
| 2012/0322270 | A1 * | 12/2012 | Long | H01J 37/321 438/710 |
| 2013/0135058 | A1 | 5/2013 | Long et al. | |

\* cited by examiner

*Primary Examiner* — Huy Q Phan
*Assistant Examiner* — Alvaro Fortich

(57) ABSTRACT

A substrate processing system includes a processing chamber including a dielectric window and a pedestal for supporting a substrate during processing. A gas supply system supplies gas to the processing chamber. A coil is arranged outside of the processing chamber adjacent to the dielectric window. A radio frequency (RF) source supplies RF signals to the coil to create RF plasma in the processing chamber. N flux attenuating portions are arranged in a spaced pattern adjacent the coil, wherein N is an integer greater than one.

24 Claims, 7 Drawing Sheets

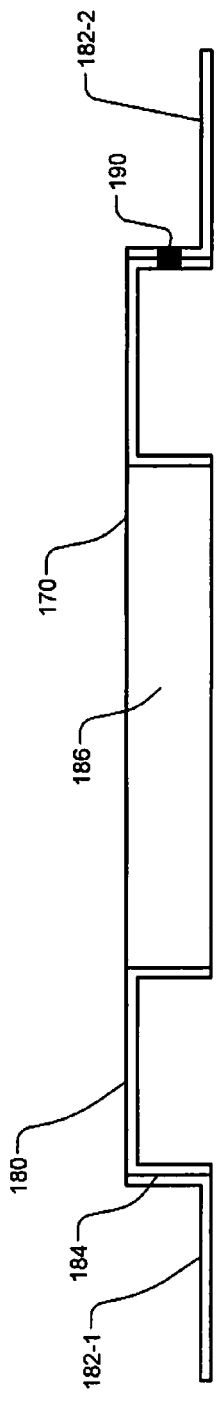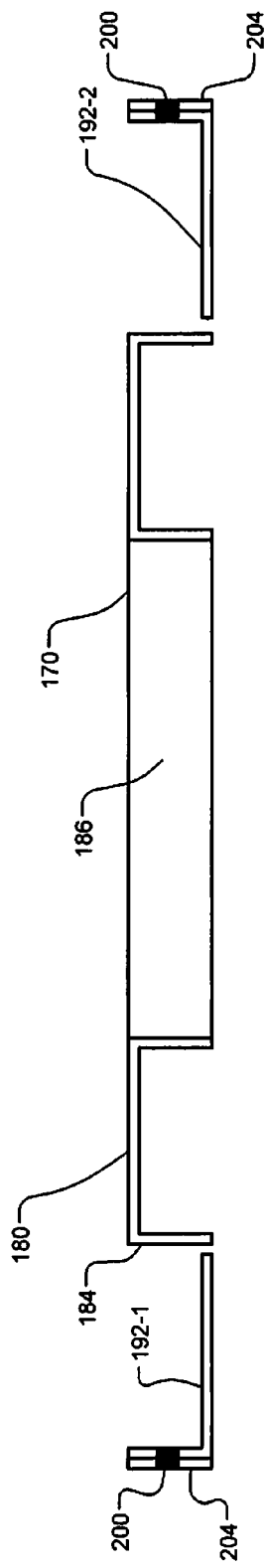
FIG. 4
FIG. 5

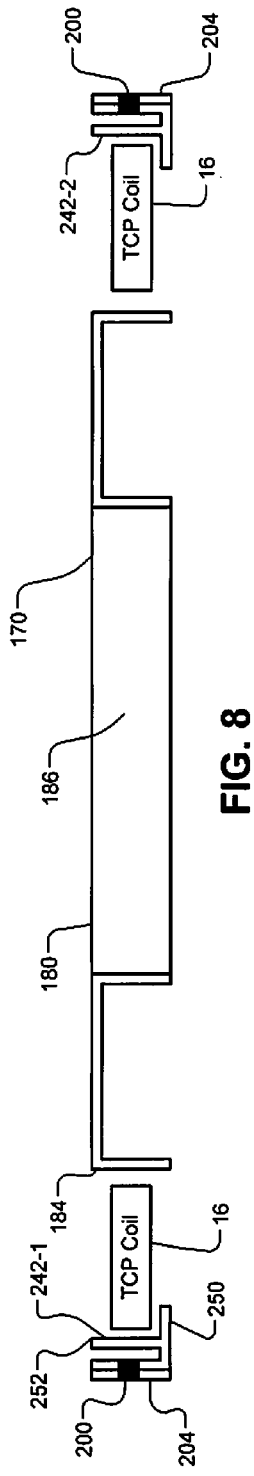
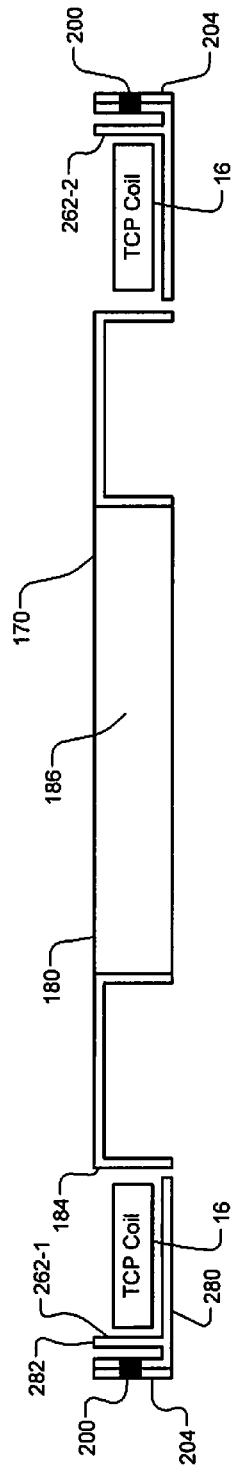
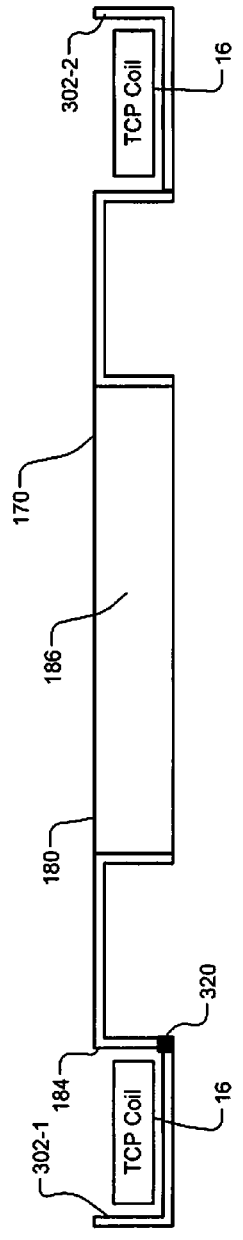

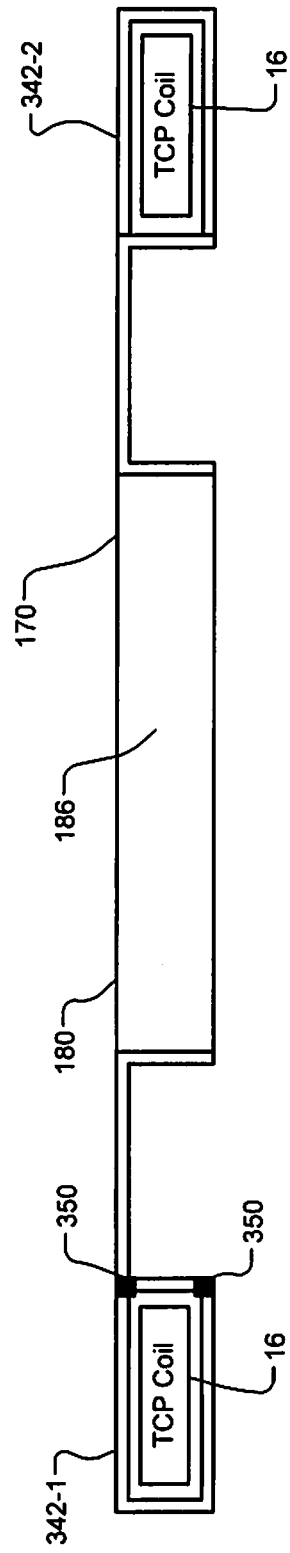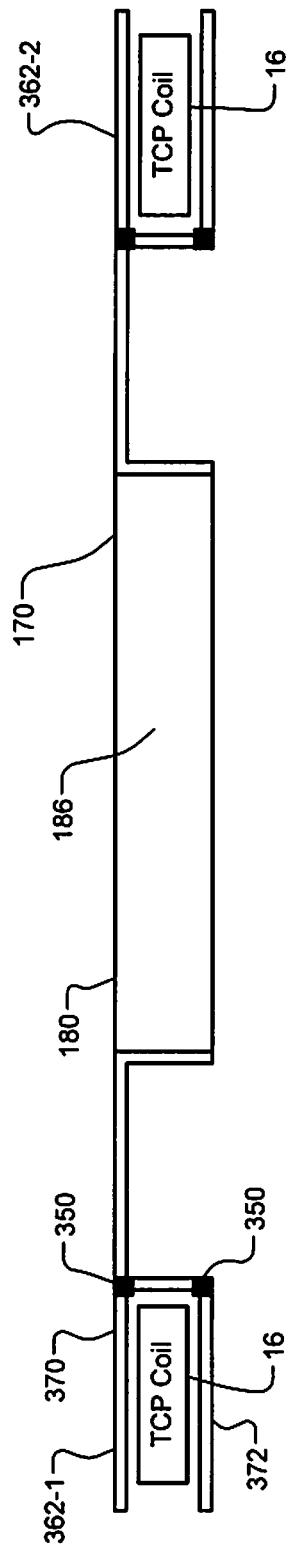

SYSTEMS AND METHODS FOR IMPROVING WAFER ETCH NON-UNIFORMITY WHEN USING TRANSFORMER-COUPLED PLASMA

CROSS-REFERENCE TO RELATED APPLICATIONS

This application claims the benefit of U.S. Provisional Application No. 61/941,778, filed on Feb. 19, 2014. The entire disclosure of the application referenced above is incorporated herein by reference.

FIELD

The present disclosure relates to substrate processing systems, and more particularly to substrate processing systems and methods for etching substrates using transformer-coupled plasma.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to deposit and etch thin film on substrates such as semiconductor wafers. Examples of etching include wet chemical etching and dry etching. Some dry etching is performed using plasma generated by inductively-coupled plasma. The inductively-coupled plasma may be generated by transformer-coupled plasma (TCP) coils.

Etch rate (ER) residual non-uniformity within a semiconductor wafer can be caused by non-uniformity in magnetic flux generated by the TCP coils. The non-uniformity may be caused by an increase in localized coil current due to one or more nodes forming on the TCP coil. Most inductive-coupled plasma systems including TCP coils rely on coil and chamber top end symmetry to eliminate magnetic flux non-uniformity. However, perfect symmetry is very difficult to achieve due to voltage nodes within the coil and non-symmetric surrounding hardware.

SUMMARY

This section provides a general summary of the disclosure, and is not a comprehensive disclosure of its full scope or all of its features.

A substrate processing system includes a processing chamber including a dielectric window and a pedestal for supporting a substrate during processing. A gas supply system supplies gas to the processing chamber. A coil is arranged outside of the processing chamber adjacent to the dielectric window. A radio frequency (RF) source supplies RF signals to the coil to create RF plasma in the processing chamber. N flux attenuating portions are arranged in a spaced pattern adjacent to the coil, wherein N is an integer greater than one.

In other features, the N flux attenuating portions are arranged between the coil and the dielectric window.

In other features, the N flux attenuating portions are arranged adjacent to a radially outer edge of the coil.

In other features, a plenum is arranged between the coil and the dielectric window. The N flux attenuating portions project radially outwardly from the plenum. A gas supply provides gas to the plenum during operation.

In other features, the N flux attenuating portions are spaced at 360/N degree intervals.

In other features, the coil includes a first coil that is wound within at least part of a second coil. Opposite ends of the first coil are arranged 180 degrees apart, and opposite ends of the second coil are arranged 180 degrees apart. N is equal to 4, the N flux attenuating portions are spaced at 90 degree intervals, and the N flux attenuating portions are rotated 30-60 degrees relative to the opposite ends of the first coil and the second coil.

In other features, the N flux attenuating portions are made of at least one of polytetrafluoroethylene, glass-filled polytetrafluoroethylene, polyphenylsulfone, or polyetheretherketone.

In other features, a ring portion is arranged around the coil. The N flux attenuating portions extend radially inwardly from the ring portion between the coil and the dielectric window.

In other features, a transformer-coupled capacitive tuning circuit includes at least one capacitor. The transformer-coupled capacitive tuning circuit is connected between the RF source and the coil.

A method for operating a substrate processing system includes providing a processing chamber including a dielectric window and a pedestal for supporting a substrate; arranging a coil adjacent to the dielectric window; arranging N flux attenuating portions in a spaced pattern adjacent to the coil, wherein N is an integer greater than one; supplying gas to the processing chamber; and supplying RF signals to the coil to create RF plasma in the processing chamber.

In other features, the N flux attenuating portions are arranged between the coil and the dielectric window.

In other features, the N flux attenuating portions are arranged adjacent to a radially outer edge of the coil.

In other features, the method includes arranging a plenum between the coil and the dielectric window. The N flux attenuating portions project radially outwardly in a spaced pattern from the plenum. The method includes providing gas to the plenum during operation. The method includes spacing the N flux attenuating portions at 360/N degree intervals.

In other features, the coil includes a first coil that is wound within at least part of a second coil. The method includes arranging opposite ends of the first coil 180 degrees apart and opposite ends of the second coil 180 degrees apart.

In other features, N is equal to 4, and the method further includes spacing the N flux attenuating portions at 90 degree intervals and rotating the N flux attenuating portions 30-60 degrees relative to the opposite ends of the first coil and the second coil.

In other features, the N flux attenuating portions are made of at least one of polytetrafluoroethylene and glass-filled polytetrafluoroethylene.

In other features, the method includes arranging a ring portion around the coil. The N flux attenuating portions extend radially inwardly from the ring portion between the coil and the dielectric window.

In other features, the method includes connecting a transformer-coupled capacitive tuning circuit between the coil and an RF source generating the RF signals.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The present disclosure will become more fully understood from the detailed description and the accompanying drawings, wherein:

FIGS. 4-12 are side cross-sectional views of other examples of a gas plenum with flux attenuating portions or projections.

In the drawings, reference numbers may be reused to identify similar and/or identical elements.

DETAILED DESCRIPTION

Figure 1:
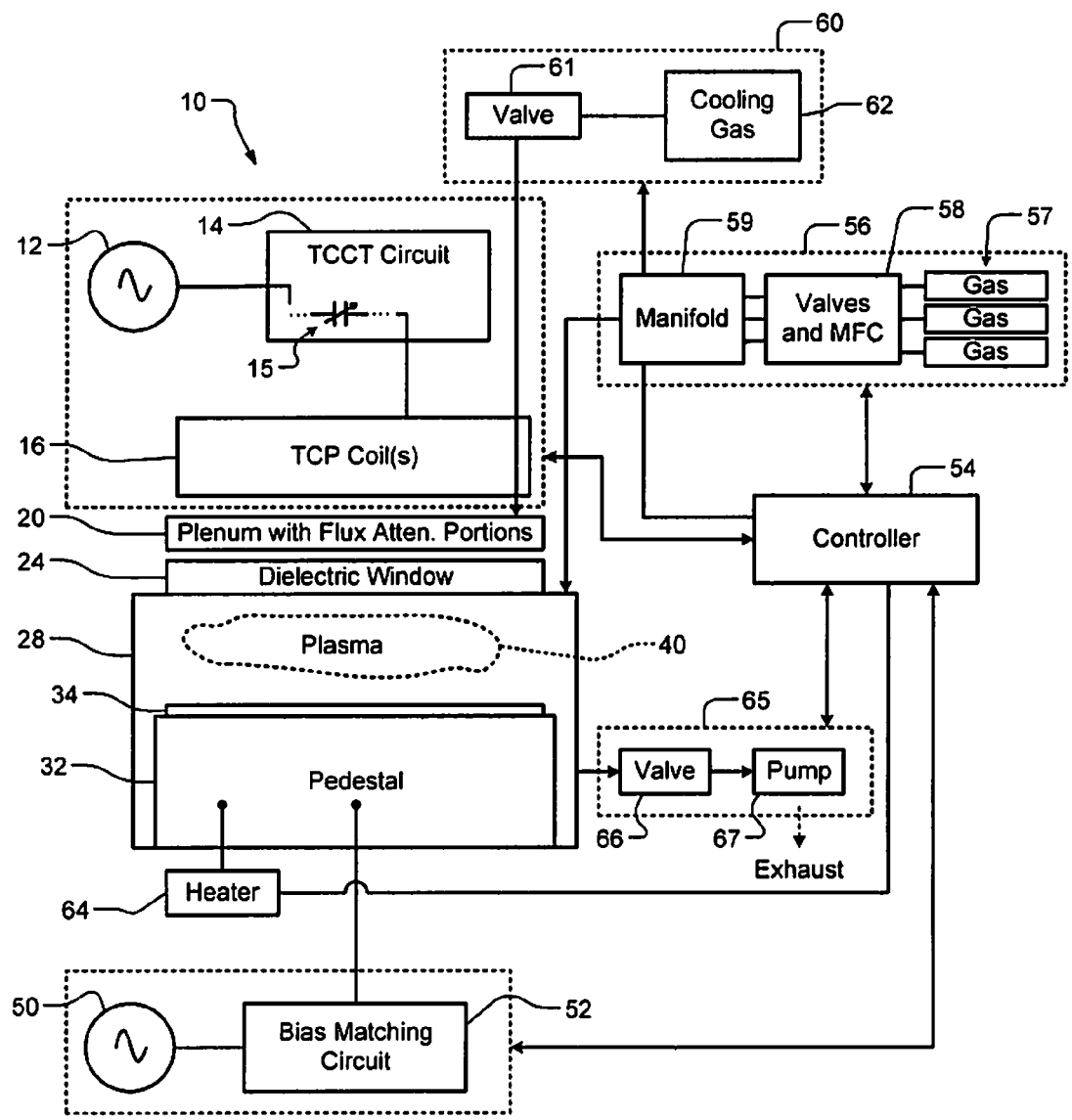
FIG. 1 is a functional block diagram of an example of a substrate processing system for etching substrates according to the present disclosure.

Referring now to FIG. 1, an example of a substrate processing system 10 according to the present disclosure is shown. The substrate processing system 10 includes an RF source 12 connected to a transformer-coupled capacitive tuning (TCCT) circuit 14, which is connected to TCP coils 16. The TCCT circuit 14 typically includes one or more fixed or variable capacitors 15. An example of a TCCT circuit 14 is shown and described in commonly assigned U.S. Publication No. 2013/0135058 to Long et al., which is hereby incorporated by reference in its entirety. The TCP coils 16 may include a pair of coils or an inner coil pair and an outer coil pair.

A gas plenum 20 with N flux attenuating portions is arranged between the TCP coils 16 and a dielectric window 24. As will be described below, flux attenuating portions on the gas plenum 20 extend between selected portions of the TCP coils 16 and the dielectric window 24 and are not present between other portions of the TCP coils 16 and the dielectric window 24. The flux attenuating portions 82 compensate magnetic flux distribution of the TCP coils 16. The compensation attenuates an increase in magnetic flux due current node formation on the TCP coil 16. The increase may be caused by the TCP coil 16 being terminated by a capacitor such as a capacitor in the TCCT circuit 14. In other words, the flux attenuating portions scavenge some of the TCP coil flux, with the result being a more uniform magnetic flux profile from the TCP coil 16. This leads to an improvement in plasma uniformity. As a result, high etch rate locations on the substrate will be reduced, which will improve substrate uniformity.

The dielectric window 24 is arranged along one side of a processing chamber 28. The processing chamber 28 further comprises a pedestal 32 that supports a substrate 34. The pedestal 32 may include an electrostatic chuck, a mechanical chuck or other type of chuck. Plasma 40 is generated inside of the processing chamber 28. The plasma 40 etches an exposed surface of the substrate 34. An RF source 50 and a bias matching circuit 52 may be used to bias the pedestal 32 during operation.

A gas delivery system 56 may be used to supply a gas mixture to the processing chamber 28. The gas delivery system 56 may include process gas sources 57, a metering system 58 such as valves and mass flow controllers, and a manifold 59. A gas delivery system 60 may be used to deliver gas 62 via a valve 61 to the gas plenum 20. The gas may include cooling gas that is used to cool the TCP coils 16 and the dielectric window 24. A heater 64 may be used to heat the pedestal 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, supply of cooling gas, etc.

Figure 2:
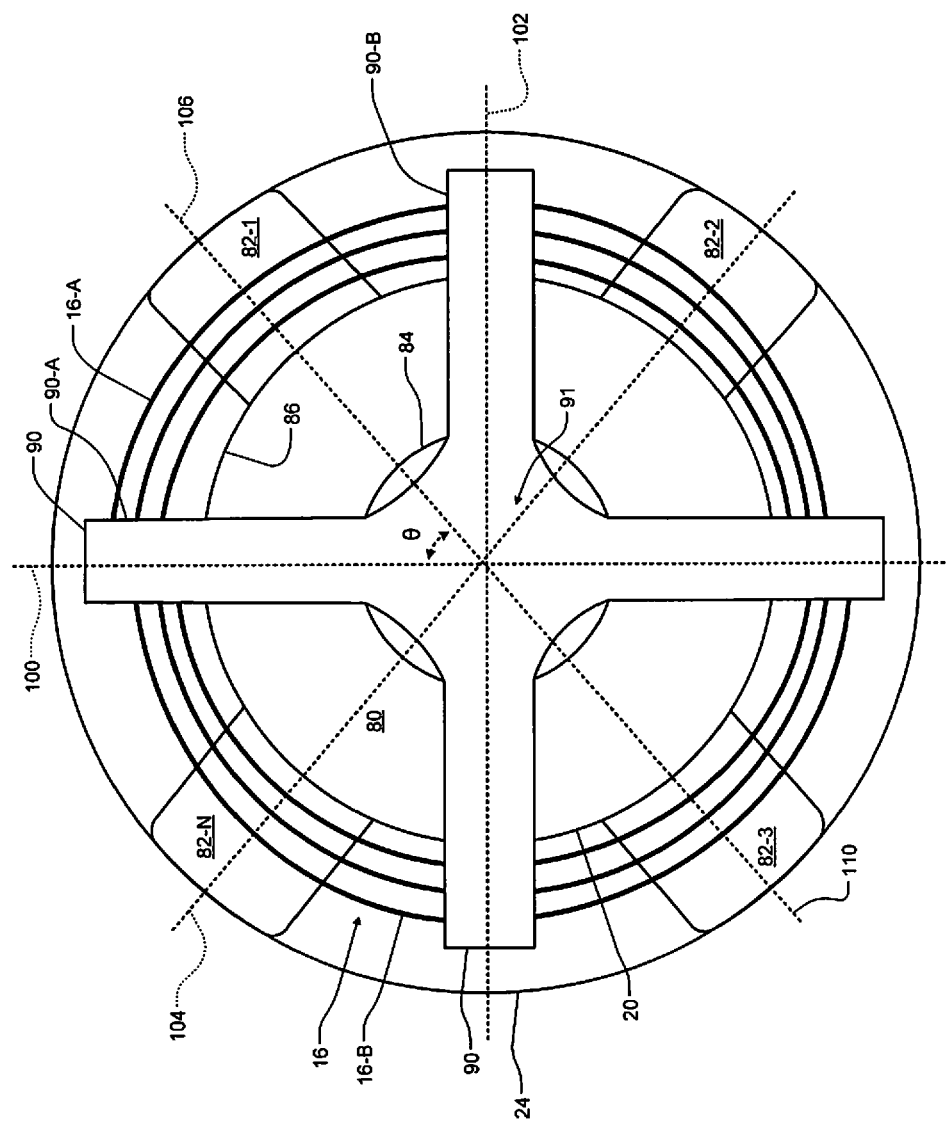
FIG. 2 is a plan view of an example of a transformer-coupled plasma coil and a gas plenum with flux attenuating portions or projections according to the present disclosure.

Referring now to FIG. 2, an example of the TCP coils 16 and the gas plenum 20 according to the present disclosure is shown. The gas plenum 20 is shown to include an annular body 80 defining an inner opening 84 and an outer edge 86. In some examples, the inner opening 84 is circular and the outer edge 86 is circular. A plurality of flux attenuating portions 82-1, 82-2, . . . , and 82-N, where N is an integer greater than one (collectively flux attenuating portions 82), extend outwardly from the outer edge 86 of the annular body 80. In some examples, the flux attenuating portions 82 may extend outwardly in a radial direction.

For example only, the RF current distribution on the TCP coil 16 may lead to a quad pole pattern on the substrate 34, which may adversely impact substrate uniformity. In this example, the number of flux attenuating portions N may be set equal to 4. The four flux attenuating portions 82 are arranged to reduce the effect of the quad pole pattern by attenuating high flux areas of the TCP coil 16, which significantly reduces the quad pole pattern and enhances substrate uniformity. A thickness of the flux attenuating portions 82 may be selected to achieve a desired level of attenuation. The thickness of the flux attenuating portions 82 may also be varied in a circumferential direction (e.g. thinner at opposite circumferential edges of the flux attenuating portion 82 and thicker in the center).

A supporting structure 90 may be connected to a top portion of the gas plenum 20. For example only, the supporting structure 90 may be "X"-shaped and may include first and second portions 90-A and 90-B that are connected in a middle portion 91 thereof. The first and second portions 90-A and 90-B may be arranged at an angle of 360/N or, for example, 90 degrees when N=4. The supporting structure 90 may be used to provide uniform spacing of the TCP coils and/or an external electrical connection to the TCP coils 16-A and 16-B. Ends of the coils 16-A and 16-B may be connected adjacent to opposite ends of one of the portions, e.g. adjacent to ends of first portion 90-A in FIG. 2.

In some examples, N=4 and the flux attenuating portions 82 are arranged at a predetermined angle θ relative to the first and second portions 90-A and 90-B of the supporting structure 90. In some examples, the predetermined angle θ is defined between an imaginary line aligned with a center of opposite flux attenuating portions (e.g., 82-1 and 82-3, and 82-2 and 82-4) and an imaginary line aligned with a center of the first portion 90-A of the supporting structure 90. In some examples, the predetermined angle θ is set based on pole patterns of the magnetic flux. In other examples, the flux attenuating portions are uniformly spaced and symmetric. In other examples, the predetermined angle θ is between 30-60 degrees, although other angles can be used. For example only, θ=30-45 degrees in the example shown in FIG. 2.

Figure 3:
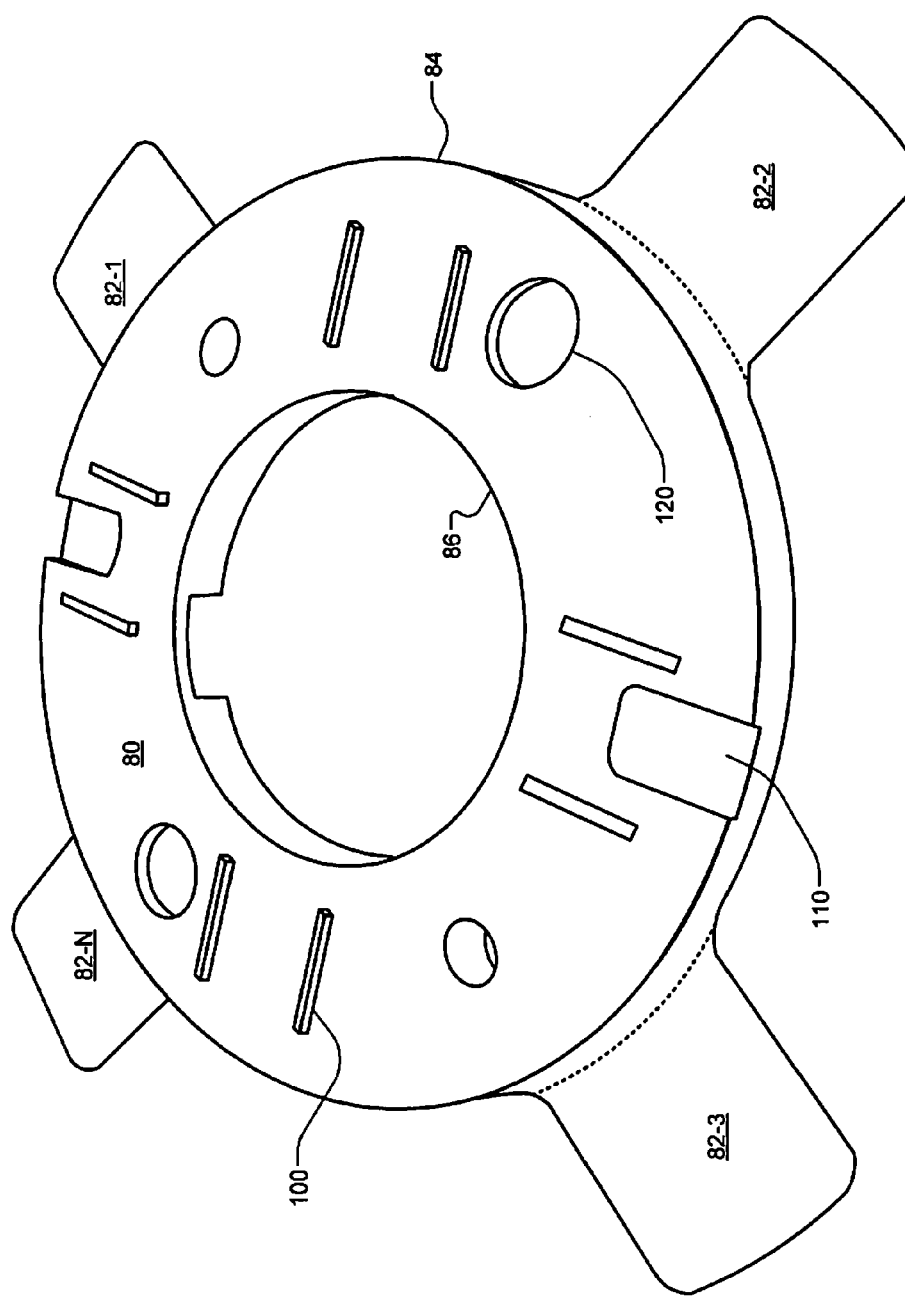
FIG. 3 is a perspective view of an example of a gas plenum with flux attenuating portions or projections according to the present disclosure.

Referring now to FIG. 3, an example of the gas plenum 20 according to the present disclosure is shown. Alignment projections 100, slots 110 or other structures may be used to align the supporting structure 90 relative to the gas plenum 20. Openings such as 120 may be used to input or remove cooling gas between the gas plenum 20 and the dielectric window 24. As can be appreciated, while the flux attenuating portions 82 are shown integrated with the gas plenum 20, the flux attenuating portions 82 can be made separately and attached to the gas plenum 20. Alternately, the flux attenuating portions 82 can be attached to another structure other than the gas plenum 20.

Referring now to FIG. 4, another example of a gas plenum 170 is shown. In this example, N flux attenuating portions (such as 182-1 and 182-2 shown in FIG. 4) (collectively flux attenuating portions 182) are connected a radially outer edge 184 of a body 180 of the gas plenum 170. The gas plenum 170 may further include a central opening 186 as in the preceding example. The flux attenuating portions 182 may be connected to the body 180 using fasteners, interlocking connections such as male/female connections, adhesive or other type of connection (schematically shown at 190). As can be appreciated, the connection between the plenum and the flux attenuating portions can be moveable around the outer surface of the plenum to allow tuning.

In some examples, the gas plenum and/or the flux attenuating portions may be formed from glass filled polytetrafluoroethylene, glass-filled polytetrafluoroethylene, polyphenylsulfone (PPSU), polyetheretherketone (PEEK), or other higher temperature, injection moldable thermoplastics.

The flux attenuating portions 82 on the gas plenum 20 compensate the magnetic flux distribution of the TCP coils 16. The compensation attenuates the increase in magnetic flux due current node formation on the TCP coils 16. In other words, the flux attenuating portions 82 scavenge some of the TCP coil flux. As a result, the TCP coil 16 has a more uniform magnetic flux profile. This leads to an improvement in plasma uniformity. As a result, high etch rate locations on the substrate have been reduced significantly, which improves substrate uniformity.

Referring now to FIG. 5, while the flux attenuating portions 182 in FIG. 4 are shown extending radially outward from the plenum, flux attenuating portions 192-1 and 192-2 (collectively flux attenuating portions 192) in FIG. 5 are attached to another structure such as a ring 204 or other suitable structure. The ring 204 can have a diameter that is smaller or larger than the TCP coil 16. If the ring 204 has a larger diameter, the flux attenuating portions 192 can extend radially inwardly between the TCP coils 16 and the dielectric window 24. The flux attenuating portions 192 can be attached to the ring 204 using fasteners, interlocking connections such as male/female connections, adhesive or other type of connection (schematically shown at 200). As can be appreciated, there are still other ways of mounting the N flux attenuating portions relative to the coil and the dielectric window.

Figure 6:
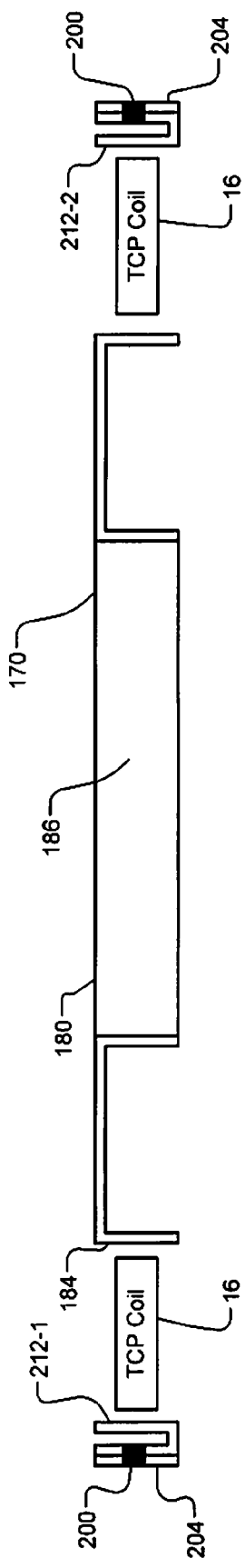

Referring now to FIG. 6, flux attenuating portions 212-1 and 212-2 (collectively flux attenuating portions 212) are arranged alongside of the TCP coils rather than in between the TCP coils 16 and the dielectric window 24. The flux attenuating portions 212 are arranged adjacent to a radially outer side of the TCP coils 16. In some examples, the flux attenuating portions 212 can be attached to the ring 204 using fasteners, interlocking connections such as male/female connections, adhesive or other type of connections (schematically shown at 200). In some examples, the flux attenuating portions 212 may be arranged generally perpendicular to a plane including the TCP coils 16 or at other angles that are not perpendicular.

Figure 7:
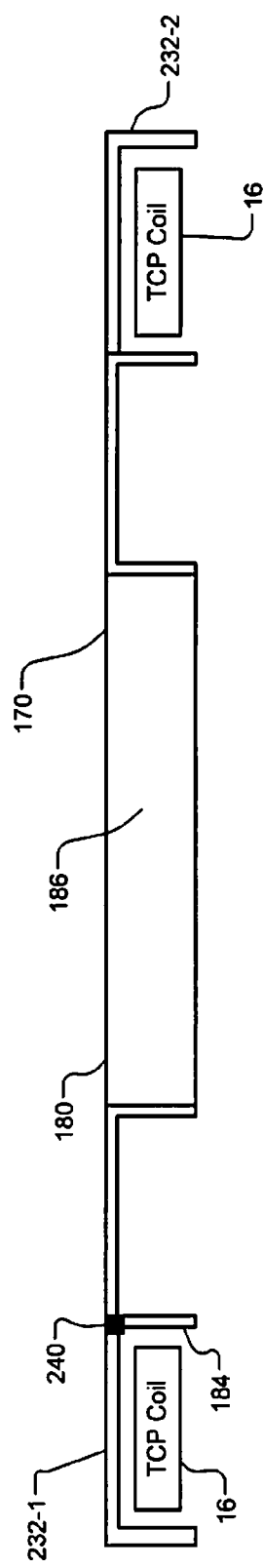

Referring now to FIG. 7, flux attenuating portions 232-1 and 232-2 (collectively flux attenuating portions 232) may be generally "L"-shaped in some examples and may be arranged over a top side of the TCP coils and along a radially outer side of the TCP coils 16. In some examples, the flux attenuating portions 232 can be attached to or formed with the body 180. In some examples, the flux attenuating portions 232 can be attached to the body 180 using fasteners, interlocking connections such as male/female connections, adhesive or other type of connections (schematically shown at 240).

Referring now to FIG. 8, in some examples flux attenuating portions 242-1 and 242-2 (collectively flux attenuating portions 242) may be arranged alongside of the TCP coils 16 and partially between the TCP coils 16 and the dielectric window 24 (FIG. 1). The flux attenuating portions 242 may include a radially inwardly extending portion 250 and a vertically extending portion 252. In some examples, the flux attenuating portions 242 can be attached to the ring 204 using fasteners, interlocking connections such as male/female connections, adhesive or other type of connections (schematically shown at 200). In some examples, the vertically extending portion 252 of the flux attenuating portions 242 may be arranged generally perpendicular to a plane including the TCP coils 16 or at other angles that are not perpendicular.

Referring now to FIG. 9, in some examples flux attenuating portions 262-1 and 262-2 (collectively flux attenuating portions 262) may be arranged alongside of the TCP coils 16 and between the TCP coils 16 and the dielectric window 24 (FIG. 1). The flux attenuating portions 262 may include a radially inwardly extending portion 280 that extends beyond a radially inner edge of the TCP coils 16 and a vertically extending portion 282. In some examples, the flux attenuating portions 262 can be attached to the ring 204 using fasteners, interlocking connections such as male/female connections, adhesive or other type of connections (schematically shown at 200). In some examples, the vertically extending portion 282 of the flux attenuating portions 262 are arranged radially outside of the TCP coils 16 and generally perpendicular to a plane including the TCP coils 16.

Referring now to FIG. 10, in some examples flux attenuating portions 302-1 and 302-2 (collectively flux attenuating portions 302) may be arranged alongside of a radially outer edge of the TCP coils 16 and between the TCP coils 16 and the dielectric window 24 (FIG. 1). In some examples, the flux attenuating portions 302 can be attached to or formed with the body 180. In some examples, the flux attenuating portions 302 can be attached to the body 180 using fasteners, interlocking connections such as male/female connections, adhesive or other type of connections (schematically shown at 320).

Referring now to FIG. 11, in some examples flux attenuating portions 342-1 and 342-2 (collectively flux attenuating portions 342) may be generally "U"-shaped and may surround the TCP coils 16. In some examples, the flux attenuating portions 342 can be removably attached to the body. In some examples, the flux attenuating portions 342 can be attached to the body 180 using fasteners, interlocking connections such as male/female connections, adhesive or other type of connections (schematically shown at 350).

Referring now to FIG. 12, in some examples flux attenuating portions 362-1 and 362-2 (collectively flux attenuating portions 362) include an upper portion 370 and a lower portion 372 arranged adjacent to upper and lower sides of the TCP coils 16, respectively. In some examples, the flux attenuating portions 362 can be removably attached to the body. In some examples, the flux attenuating portions 362 can be attached to the body 180 using fasteners, interlocking connections such as male/female connections, adhesive or other type of connections (schematically shown at 350).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A substrate processing system, comprising:
   a processing chamber including a dielectric window and a pedestal for supporting a substrate during processing;
   a gas supply system configured to supply gas to the processing chamber;
   a coil arranged outside of the processing chamber adjacent to the dielectric window;
   a radio frequency (RF) source configured to supply RF signals to the coil to create RF plasma in the processing chamber;
   a gas plenum arranged between the coil and the dielectric window, wherein the gas plenum includes a body; and
   N flux attenuating portions arranged in a spaced pattern adjacent to the coil, wherein N is an integer greater than one, wherein at least one of
      the N flux attenuating portions are attached to the body of the plenum, and the N flux attenuating portions extend outwardly from the body, and
      a ring portion is arranged around the coil, wherein the N flux attenuating portions are attached to the ring and the N flux attenuating portions extend inwardly from the ring portion.

2. The substrate processing system of claim 1, wherein the N flux attenuating portions are arranged between the coil and the dielectric window.

3. The substrate processing system of claim 1, wherein the N flux attenuating portions are arranged adjacent to a radially outer edge of the coil.

4. The substrate processing system of claim 2, wherein the N flux attenuating portions project radially outwardly from the body of the plenum.

5. The substrate processing system of claim 4, further comprising a gas supply to provide gas to the plenum during operation.

6. The substrate processing system of claim 1, wherein the N flux attenuating portions are spaced at 360/N degree intervals.

7. The substrate processing system of claim 6, wherein N is equal to 4.

8. The substrate processing system of claim 1, wherein the coil includes a first coil that is wound within at least part of a second coil, wherein opposite ends of the first coil are arranged 180 degrees apart, and wherein opposite ends of the second coil are arranged 180 degrees apart.

9. The substrate processing system of claim 8, wherein N is equal to 4, the N flux attenuating portions are spaced at 90 degree intervals, and the N flux attenuating portions are rotated 30-60 degrees relative to the opposite ends of the first coil and the second coil.

10. The substrate processing system of claim 1, wherein the N flux attenuating portions are made of at least one of polytetrafluoroethylene, glass-filled polytetrafluoroethylene, polyphenylsulfone, or polyetheretherketone.

11. The substrate processing system of claim 1, wherein the N flux attenuating portions extend radially inwardly from the ring portion between the coil and the dielectric window.

12. The substrate processing system of claim 1, further comprising a transformer-coupled capacitive tuning circuit including at least one capacitor, wherein the transformer-coupled capacitive tuning circuit is connected between the RF source and the coil.

13. A method for operating a substrate processing system, comprising:
   providing a processing chamber including a dielectric window and a pedestal for supporting a substrate;
   arranging a coil adjacent to the dielectric window;
   arranging a gas plenum having a body between the coil and the dielectric window;
   arranging N flux attenuating portions in a spaced pattern adjacent to the coil, wherein N is an integer greater than one, wherein at least one of the N flux attenuating portions are attached to the body of the plenum, and the N flux attenuating portions extend outwardly from the body, and a ring portion is arranged around the coil, wherein the N flux attenuating portions are attached to the ring portion and the N flux attenuating portions extend inwardly from the ring portion;

supplying gas to the processing chamber; and supplying RF signals to the coil to create RF plasma in the processing chamber.

14. The method of claim 13, wherein the N flux attenuating portions are arranged between the coil and the dielectric window.

15. The method of claim 13, wherein the N flux attenuating portions are arranged adjacent to a radially outer edge of the coil.

16. The method of claim 14, wherein the N flux attenuating portions project radially outwardly in a spaced pattern from the plenum.

17. The method of claim 16, further comprising providing gas to the plenum during operation.

18. The method of claim 13, further comprising spacing the N flux attenuating portions at 360/N degree intervals.

19. The method of claim 13, wherein N is equal to 4.

20. The method of claim 13, wherein the coil includes a first coil that is wound within at least part of a second coil, and further comprising:

arranging opposite ends of the first coil 180 degrees apart; and arranging opposite ends of the second coil 180 degrees apart.

21. The method of claim 20, wherein N is equal to 4, and further comprising:

spacing the N flux attenuating portions at 90 degree intervals; and rotating the N flux attenuating portions 30-60 degrees relative to the opposite ends of the first coil and the second coil.

22. The method of claim 13, wherein the N flux attenuating portions are made of at least one of polytetrafluoroethylene, glass-filled polytetrafluoroethylene, polyphenylsulfone, or polyetheretherketone.

23. The method of claim 13, wherein the N flux attenuating portions extend radially inwardly from the ring portion between the coil and the dielectric window.

24. The method of claim 13, further comprising connecting a transformer-coupled capacitive tuning circuit between the coil and an RF source generating the RF signals.

* * * * *